(12) United States Patent
Nurser

(10) Patent No.: US 6,359,816 B1
(45) Date of Patent: Mar. 19, 2002

(54) RESPONSE TIME MEASUREMENT

(75) Inventor: Henry Nurser, Bristol (GB)

(73) Assignee: STMicroelectronics Limited, Almondsbury Bristol (GB)

( * ) Notice: Subject to any disclaimer, the term of this patent is extended or adjusted under 35 U.S.C. 154(b) by 0 days.

(21) Appl. No.: 09/563,449

(22) Filed: May 1, 2000

(30) Foreign Application Priority Data

May 11, 1999 (GB) ............................................. 9910943

(51) Int. Cl.[7] ................................................ G11C 7/00
(52) U.S. Cl. ...................................... 365/201; 365/194
(58) Field of Search ................................ 365/194, 201, 365/233; 710/58, 60; 714/819, 824

(56) References Cited

U.S. PATENT DOCUMENTS

| | | | |
|---|---|---|---|
| 4,736,351 A | * 4/1988 | Oliver | 368/118 |
| 5,440,516 A | * 8/1995 | Slemmer | 365/201 |
| 5,537,663 A | * 7/1996 | Belmont et al. | 710/17 |
| 5,809,227 A | * 9/1998 | Basile | 714/47 |
| 5,875,135 A | 2/1999 | Patwardhan et al. | 365/194 |
| 6,185,637 B1 | * 2/2001 | Strongin et al. | 710/35 |

FOREIGN PATENT DOCUMENTS

| | | | |
|---|---|---|---|
| DE | 39 10507 | 10/1990 | G01R/31/28 |
| EP | 0 343 537 | 11/1989 | H03K/5/15 |

* cited by examiner

*Primary Examiner*—Son Mai
(74) *Attorney, Agent, or Firm*—Wolf, Greenfield & Sacks, P.C.; James H. Morris

(57) ABSTRACT

To measure the response time of a circuit the time of application of a clock signal to an output flip-flop is advanced with respect to the time of application of a circuit input until a just valid output is obtained. The operation is repeated after interchanging the input and clock signals, and the two results are averaged.

14 Claims, 5 Drawing Sheets

RESPONSE TIME MEASUREMENT

FIELD OF THE INVENTION

The present invention relates to a device for measuring the response time of a circuit and to a method of measuring the response time of a circuit.

BACKGROUND OF THE INVENTION

More particularly, but not exclusively the invention relates to a method of determining the response time of a deeply embedded memory, for example a static RAM and to a device for determining the response time of a deeply embedded memory, for example a static RAM.

Current techniques for evaluating embedded fast SRAM designs use either extremely high performance testing devices, which are costly or alternatively require physical access to internal nodes. The latter tends to be inaccurate and is not capable of providing statistical sampling over long periods of time.

It will be desirable to provide a method and device capable of providing statistical data on different circuit examples and to use conventional test apparatus to collect statistically significant data.

SUMMARY OF THE INVENTION

According to a first aspect of the present invention there is provided a device for measuring the response time of a circuit, the circuit having an output for providing a response to a stimulus at an input node thereof, the device comprising first circuitry having a clock node and an output, said first circuitry being connected to store at an output thereof an output condition, said output condition corresponding to a state of said circuit output at the time of occurrence of a clock pulse at said clock node, the device further comprising second circuitry and third circuitry, said second circuitry being responsive to a second circuitry input signal at its input to provide said stimulus at said input node of said circuit, and said third circuitry being responsive to a third circuitry input signal at its input to provide a clock pulse at said clock node of said first circuitry whereby said response time is determined by a time delay between said second circuitry input signal and said third circuitry input signal, and further comprising connecting circuitry disposed between said outputs of said second and third circuitry, and said circuit input and said clock node, wherein said connecting circuitry is operable alternatively to connect said second circuitry output to said circuit input and said third circuitry output to said clock node, or said second circuitry output to said clock node and said third circuitry output node to said circuit output.

Advantageously the first circuitry comprises flip-flop circuitry.

Preferably said delay between said second and third circuitry input signals corresponds to a delay which causes said output condition to be a desired output condition.

Preferably said desired output condition is a just valid condition such that a decreased delay results in an invalid condition.

According to a second aspect of the present invention there is provided a device for measuring a response time of a circuit between an input node and a circuit output thereof, wherein said circuit output is connected via first connecting circuitry to an output pad, said device comprising a first timing signal source for providing a first timing signal to said input node via a first path, clocked circuitry having a clock node and being connected at said circuit output, said clocked circuitry having an output to said first connecting circuitry, said clocked circuitry being responsive to a clock signal at said clock node to provide to said first connecting circuitry a signal existing at said circuit output immediately prior to the occurrence of said clock signal, the device further comprising a second timing signal source for providing a second timing signal as said clock signal to said clock node via a second path, and means for determining a delay between said first and second timing signals, and further comprising controllable connecting circuitry disposed at inputs to said first and second paths and connected to said first and second timing signal sources, said controllable connecting circuitry having a control input for selectively connecting said first timing signal source to said first path and said second timing signal source to said second path, or said first timing signal source to said second path and said second timing signal source to said first path.

Preferably said delay between said first and second timing signals corresponds to a delay which causes a desired condition at said output pad.

Preferably said desired condition is a just valid condition such that a decreased delay results in an invalid condition.

Conveniently said controllable connecting circuitry comprises a multiplexer.

Advantageously said clocked circuitry comprises a flip-flop.

Preferably the device further comprises a sensing device connected to said output pad for sensing a desired output thereat.

Preferably again said circuit comprises a static RAM.

Conveniently said static RAM comprises address latch circuitry having a latch clock node as said input node, an array of memory cells coupled to said address latch circuitry, and sense amplifier circuitry having a sense amplifier output node as said output node.

According to a further aspect of the present invention there is provided a method of measuring the response time of a circuit having a circuit output for providing an output in response to a stimulus applied to a circuit input, the method comprising:

providing second circuitry having a clock node, said second circuitry having an output for storing an output condition, said output condition corresponding to the state of said circuit output at the time of occurrence of a clock pulse at said clock node;

providing switching circuitry having inputs coupled to first and second input pads via a first and third circuitry, output coupled to said circuit input and said clock node;

controlling said switching circuitry to connect said first input pad to said circuit input, and said second input pad to said clock node;

successively applying a first timing signal to said first input pad whereby a said stimulus is applied to said circuit input, and at a variable first delay after each application, providing a second timing signal to said second input pad; whereby a clock pulse is applied to said clock node;

determining, a value of said variable first delay corresponding to a desired output condition of said second circuitry;

controlling said switching circuitry to connect said first input pad to said clock node and said second input pad to said circuit input;

successively applying a third timing signal to said second input pad whereby a said stimulus is applied to said circuit input, and at a variable second delay after each application providing a fourth timing signal to said first input pad, whereby a clock pulse is applied to said clock node;

determining a value of said variable second delay corresponding to said desired output condition of said second circuitry; and averaging said value of said variable first delay and said value of said variable second delay to provide said response time.

Preferably said second circuitry comprises flip-flop circuitry.

BRIEF DESCRIPTION OF THE DRAWINGS

Embodiments of the invention will now be described, by way of example only, with reference to the accompanying drawings in which.

DESCRIPTION OF THE PREFERRED EMBODIMENTS

Figure 1:
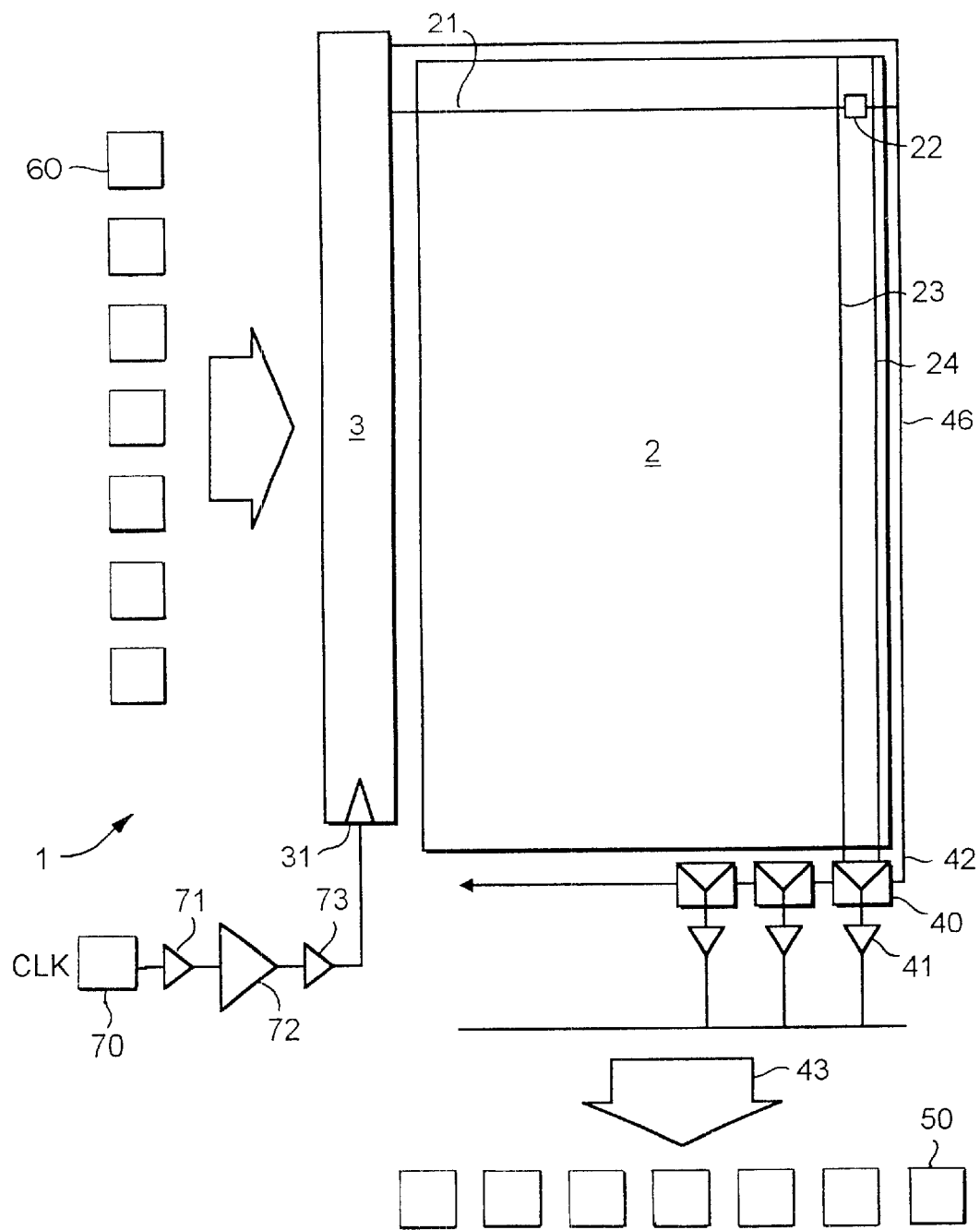
FIG. 1 shows a block schematic diagram of a conventional SRAM test chip.

In the various figures, like reference numerals refer to like parts.

Referring first to FIG. 1 a SRAM test chip 1 consists of a matrix memory array 2 which has an address register 3 connected to its plural wordlines 21, of which only one is shown. The wordlines 21 connect to a regular array of memory cells 22, of which again only one is shown.

Figure 2:
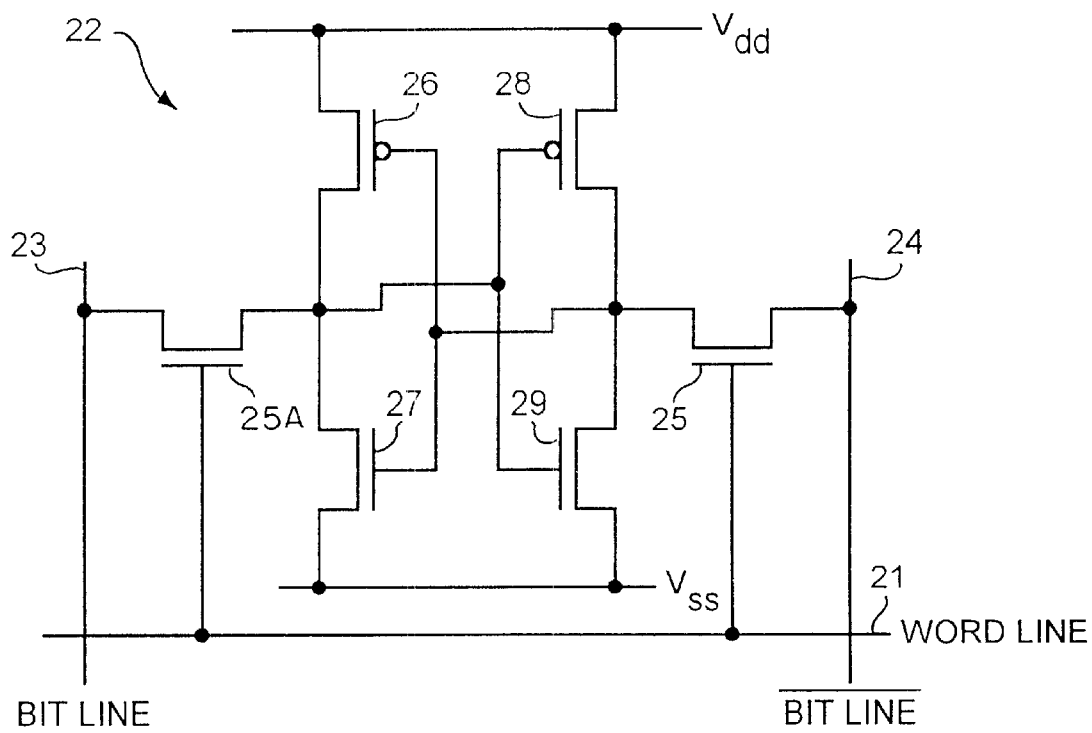
FIG. 2 shows an exemplary SRAM cell.

Referring now to FIG. 2, an exemplary memory cell 22 consists of two cross coupled inverter circuits 26, 27; 28, 29. The left hand inverter as shown consists of a P channel FET 26 connected between a positive supply VDD and a first common node and an N channel FET 27 connected between the first common node and a negative supply VSS. The right hand inverter, as shown, similarly consists of a second P conductivity FET 28 connected between a positive supply VDD and a second common node, and a second N channel FET 29 connected between the second common node and the negative supply VSS. The gates of the first P and first N transistors 26, 27 are connected together and to the second common node, and the gates of the second P transistor 28 and the second N transistor 29 are connected together and to the first common node. The first common node is connected via an N type pass transistor 25A to a first bitline 23 and the second common node is connected via a second N channel pass transistor 25 to a second bitline 24. The wordline forms the gate connection to both the first and second pass transistors 25A and 25. As is known to those skilled in the art the bitlines 23, 24 are complementary and form the column lines of the memory array whereas the wordlines form the row lines of the array.

In operation, information is written into the memory cell 22 by providing a differential potential on the bitlines 23, 24. If for example bitline 23 is connected to a logic 1 and bitline 24 to a logic 0, then when the wordline 21 goes logic 1 the pass transistors 25A, 25 will turn on and the cross-coupled inverters will latch into a corresponding state with the first common node at a high potential and the second common node at a low potential. To read from the memory the wordline is once again connected to a logic 1 and the pass transistors 25A, 25 will then turn on causing the bitline potential to tend towards the respective potential of the common node to which it is connected.

Returning again to FIG. 1, each pair of bitlines is connected to a respective sense amplifier 40. The outputs of the sense amplifiers 40 feed via buffers 41 to a corresponding number of output pads 50.

In the illustrated memory, 32 pairs of bitlines are provided and thus there are 32 sense amplifiers 40, connected to 32 output terminals 50 via output circuitry 43.

An input to the address register 3 is provided from a plurality of input pads 60 and the address register itself is clocked at an address register clock input 31. An address register clock input pad 70 is connected to the address register clock input 31 via a circuit path containing the three series elements 71, 72, 73 which figuratively illustrate the delay entailed.

The sense amplifiers 40 are also clocked, each having a clock terminal 42. A clock pulse line 46 is connected between the address register 3 and the sense amplifier clock terminal 42, and has a delay sufficient to ensure that the sense amplifier 40 will operate correctly, as later described herein.

Figure 3:
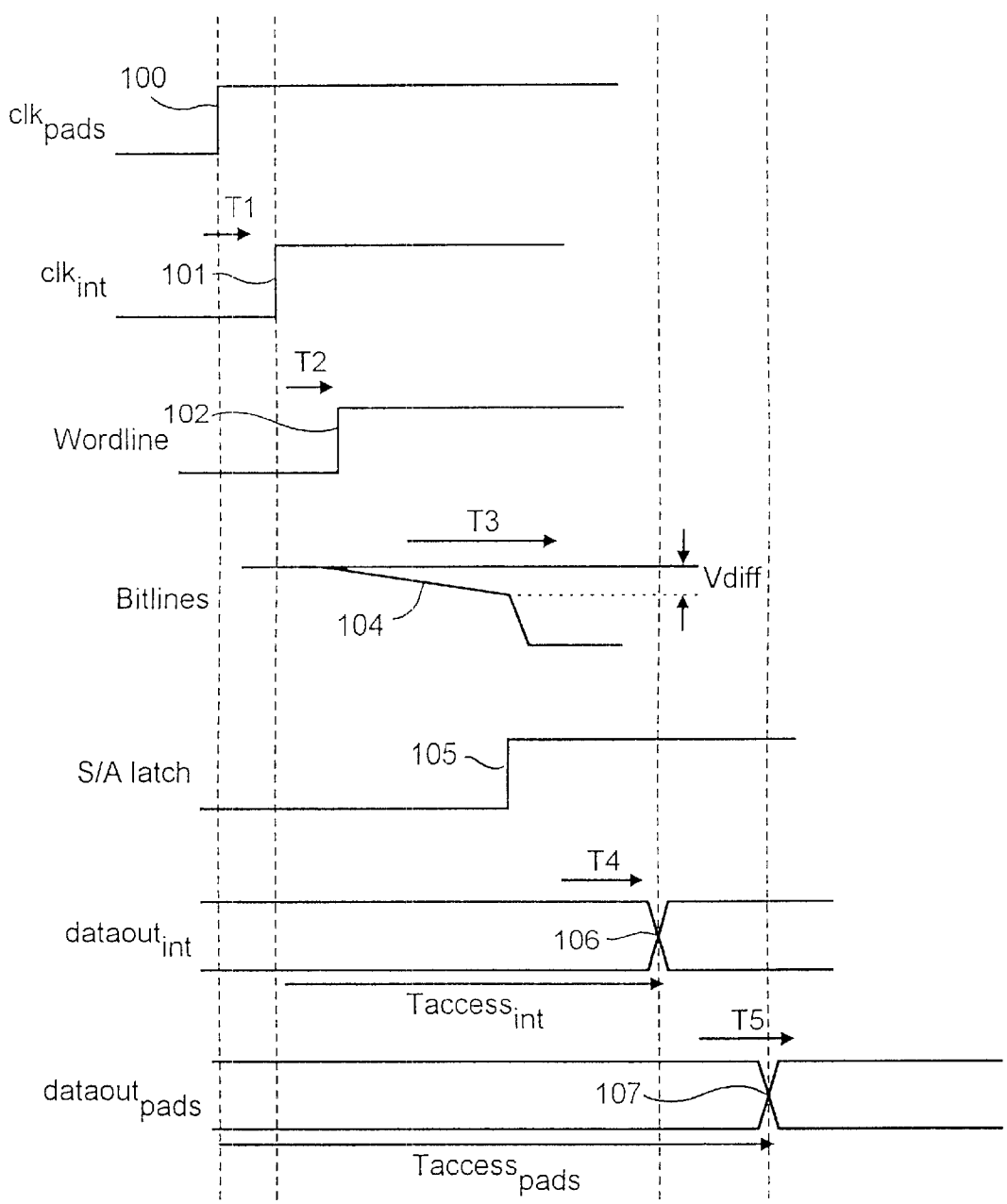
FIG. 3 shows a timing diagram for the circuit of FIG. 1.

Referring now to FIG. 3, in operation, a clock signal 100 is provided at address register clock input pad 70. After passing through the series elements 71–73, the clock pulse becomes an internal clock pulse 101 at a time T1 after the instant of application of the clock pulse 100 at the pad 70. The time period T1 is the delay induced by the path comprising series elements 71–73.

The action of the internal clock 101 on the address register 3 causes the register to apply a transition 102 to the wordlines 21 after a further time delay T2. This time delay T2 is predominantly due to the switching time of the address register 3.

As previously discussed, the transition 102 on the wordlines 21 causes the memory cells 22 to become connected to the complementary bitlines 23, 24. The bitlines 23, 24 have a relatively high capacitance and the memory cells 22 have a relatively low current driving capability which means that the change of potential of 104 is relatively slow. If the sense amplifier 42 were activated before the differential between the complementary bitlines had achieved a sufficiently high value, the sense amplifier might latch into an incorrect state. Accordingly, a clock pulse 105 is applied to the clock input 42 of the sense amplifiers 40 at a time T3 where it is expected that the bitlines will have a sufficiently high differential voltage to ensure correct sensing. In turn, the sense amplifiers require a further interval T4 before the outputs at the output nodes of the buffers 41 have achieved a valid level. Finally, the data output circuitry 43 causes a yet further delay T5 before the response to the access caused by the clock pulse 100 applied to terminal 70 is accessible at the output pads 50.

The access time of the memory array 2 is defined as the period between the application of the clock pulse 101 at clock node 31 to the appearance of a valid data output at the buffer output node 41. Where the memory 2 is embedded, access is normally available only to the input pads 60, 70 and the output pads 50. Measurements taken at these points will give a false access time measurement due to the inability to eliminate the time T1 and the final delay T5. This is especially serious where the memory 2 is a highly embedded memory due to the path length between the memory and the terminals.

Figure 4:
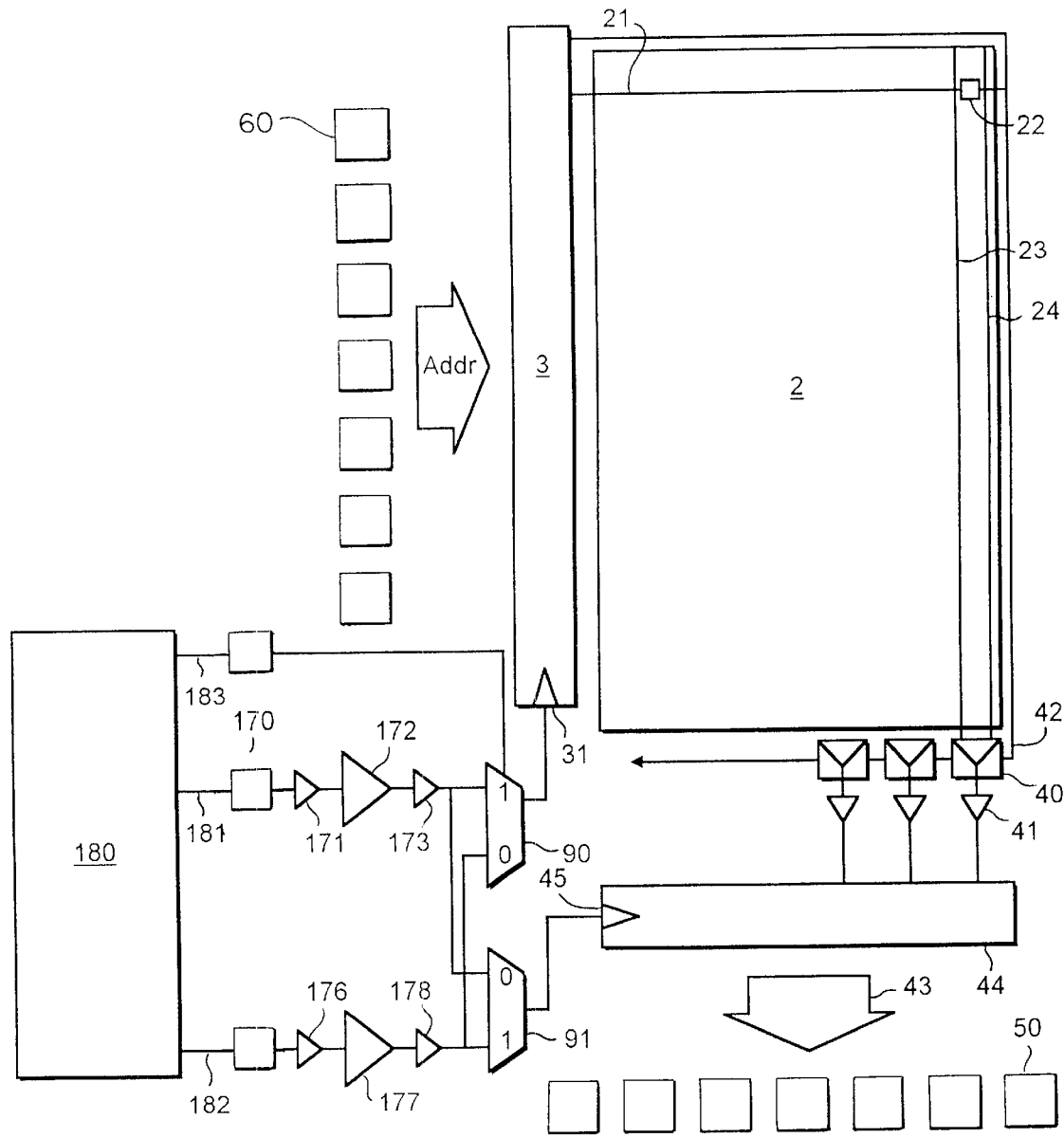
FIG. 4 shows a block schematic diagram of a memory testing device incorporating an embodiment of the present invention.

Referring now to FIG. 4 a device incorporating a first embodiment of the invention has clocked flip-flop circuitry 44 at the outputs from the buffers 41. The flip-flop circuitry 44 has a clock input 45 and is operable at the time of transition of the clock input 45 to store at its outputs the states pertaining at its inputs immediately before the clock pulse transition.

The clock input 45 is provided by the output of a multiplexer 91, and a similar multiplexer 90 provides the clock input 31 to the address register 3.

The first multiplexer 91 has a first input connected to a first clock input pad 170 via a path comprising the series elements 171, 172, 173, and a second input provided from a second clock input pad 175 via series elements 176, 177, 178. The second multiplexer 90 receives its first input from the second clock input pad 175 via the element s 176, 177, 178 and its second input derived from the first clock input pad 170 via the series elements 171, 172, 173. The multiplexers 90, 91 have a common control input derived from a control pad 79. When a first logic state is applied to the control pad 79, the first multiplexer 91 connects its first input to its output and the second multiplexer 90 connects its second input to its output. Thus in the first logic state a clock input at the first clock input pad 170 is provided to the clock input 45 of the flip-flop circuitry 44 and the second multiplexer 90 connects the second clock input pad 175 to the address register clock input 31. When the opposite logic state is applied at the control pad 79, each multiplexer connects its respective other input to its output.

To ensure accurate measurements to be made, it is important that the first inputs to each multiplexer arrive substantially simultaneously and that the second inputs to each multiplexer arrive substantially simultaneously. To achieve this it will normally be necessary to provide the multiplexers close together. Similarly, to achieve accurate results the delay between the output of each multiplexer and its respective clock input should be mutually the same.

Figure 5:
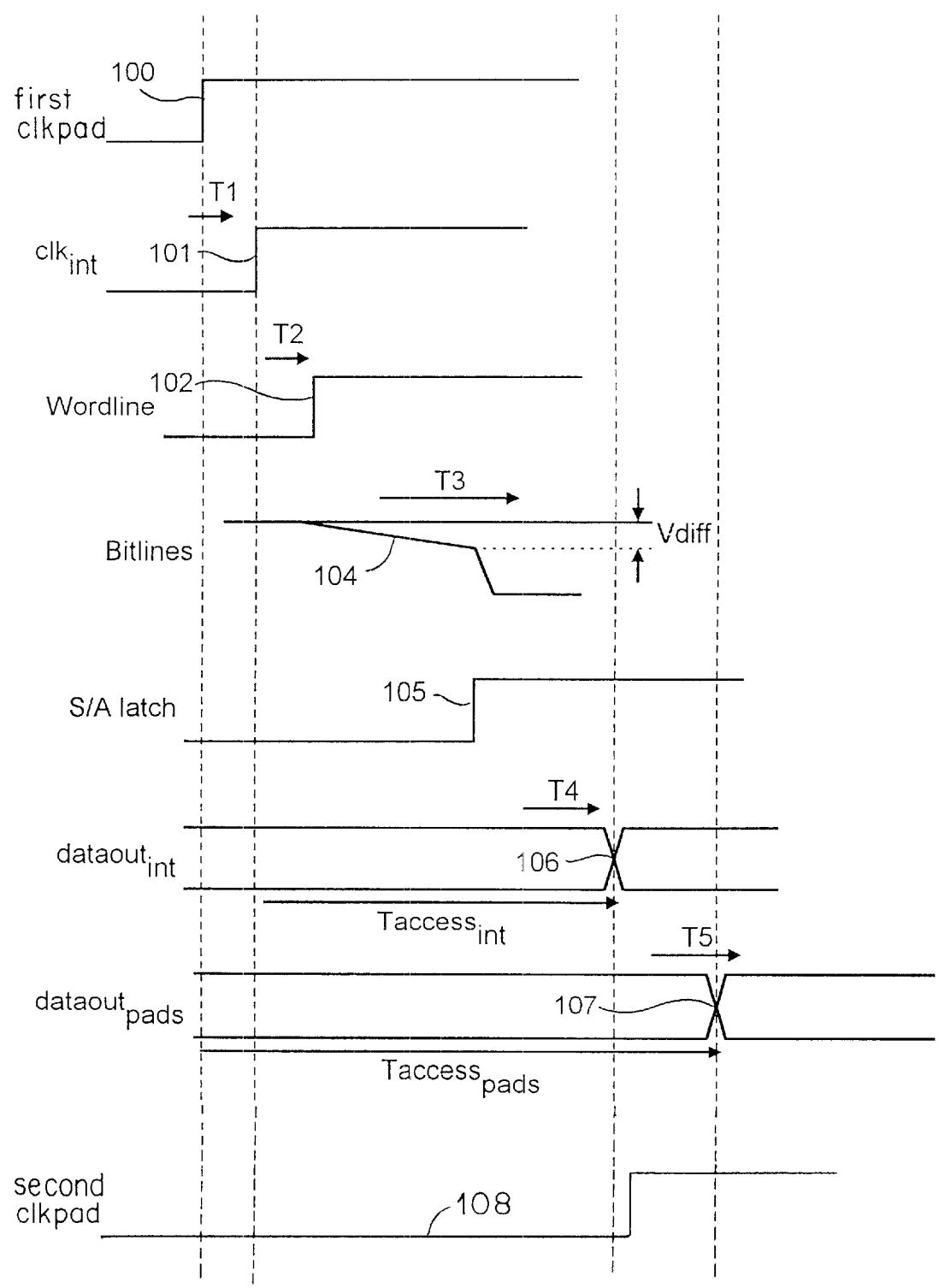
FIG. 5 shows a timing diagram for the device of FIG. 4.

The device further comprises a clock generator 180 which has two clock outputs 181, 182 the first clock output 181 being connected to the address register clock input pad 70 of the device and the clock output 182 being connected to the flip-flop circuitry clock pad 175 of the device. The clock generator further has a control output 183 connected to the control pad 79. The clock generator 180 is capable of generating the first clock signal 181 at selected intervals, each such generation being followed by generation of the second clock signal 182 at a controllable variable delay afterwards. The variable delay is controllably set to establish the access time of the memory array 2 as will now be described:

Referring now to FIG. 5 the control pad 79 is set to control the multiplexers such that first input pad 170 connects to address register clock input 31, and the second input pad connects to flip-flop circuitry clock input 45. A clock pulse 100 is applied from the first clock signal line 181 to the first clock input pad 170 and after propagation along the path comprising elements 171, 172, 173 arrives at the clock input 31 of the address register 3 to form an internal clock signal 101 at a time T1. As previously described with respect to FIG. 3, this results in the wordline transition 102 at time T2, differential bitline activation followed by sense amplifier clocking at time T3 and internal data determination to provide a valid output at the outputs of buffers 41 at time T4.

Transmission of the valid state at the output of the buffers 41 to the circuit output pads 50 will only occur if a second clock pulse from the second clock signal line 182 is applied to the second clock terminal pad 175 to arrive at the clock terminal 45 of the flip-flop circuitry 44 after the buffers 41 have produced their valid output. If a clock pulse is applied to the clock input 45 of the flip-flop circuitry 44 immediately after the instant that the buffers 41 produce their output, then the access time of the memory is equal to the period between the application of the internal clock to the address buffer 3 and the application of the second internal clock to the clock node 45. The timing is determined by varying the time of application of the second clock pulse until a "just valid" output is achieved. By "just valid" it is meant that any decrease in delay of the pulse gives rise to an invalid output.

In the present embodiment, it is not envisaged that this will be directly measured at the clock terminal 45, but instead the time between application of the first timing signal to the first clock pad 170 and the time of application of the second timing signal to the second clock pad 175 will be noted. Those skilled in the art will be aware that, unless the delay in the first path comprising elements 171, 172 and 173 is identical to the delay in the second path comprising the elements 176, 177, 178, this time will not accurately reflect the access time of the memory.

Following this measurement, the control pad 79 is then set to the opposite logic state so that the clock input 45 to the clock circuitry is provided from the first clock pad 170 and the address register clock input 31 is provided from the second clock pad 175. A similar measurement is then carried out and the time delay between application of a timing signal to the second pad 175 and the timing signal to the first clock pad 170 is derived for the condition that the outputs sensed at the output pad 50 is just valid. It will be recalled that "just valid" means that if the delay is any less, the results at output pad 50 will be invalid.

This second time delay is noted and is averaged with the first time delay to provide an accurate assessment of the access time of the memory.

Those skilled in the art will be aware that if the actual access time of the memory is $T_a$ and the path delays of the first path comprising elements 171–173 and the second path comprising elements 176–178 are $T_b$ and $T_c$ respectively, then the first measurement $T_{m1}$ will be given by:

$$T_{m1}=T_a+(T_b-T_c)$$

and the second measurement $T_{m2}$ will be give by:

$$T_{m2}=T_a+(T_c-T_b)$$

averaging these will give:

$$\tfrac{1}{2}(T_{m1}+T_{m2})=T_a$$

The invention also removes systematic inaccuracy in the placement of the pulse edges from the clock source. This is important because testers have two major specifications for placement of clock edges, namely accuracy and resolution. The accuracy of a tester is the systematic mismatch in timing generators whereas the resolution corresponds to a minimum step between allowed timings.

Where a tester exhibits an accuracy (as defined above) of $T_{off}$, $$T_{m1}=T_a+(T_b-T_c)+T_{off}$$

$$T_{m2}=T_a+(T_c-T_b)-T_{off}$$

and again averaging these gives:

$$\tfrac{1}{2}(T_{m1}+T_{m2})=T_a$$

The invention has been described in the context of measurement memory access. It will however be understood that the invention is equally applicable to the measurement of data path transit times and other response times. It is especially suitable for measurement of the response time of circuits which are not accessible to direct measurements.

What is claimed is:

1. A device for measuring the response time of a circuit, the circuit having a circuit output for providing a response to a stimulus at a circuit input node thereof, the device comprising first circuitry having a clock node and an output, said first circuitry being connected to store at an output thereof an output condition, said output condition corresponding to a state of said circuit output at the time of occurrence of a clock pulse at said clock node, the device further comprising second circuitry and third circuitry, said second circuitry being responsive to a second circuitry input signal at its input to provide said stimulus at said input node of said circuit, and said third circuitry being responsive to a third circuitry input signal at its input to provide a clock pulse at said clock node of said first circuitry whereby said response time is determined by time delay between said second circuitry input signal and said third circuitry input signal, and further comprising connecting circuitry disposed between said outputs of said second and third circuitry, and said circuit input and said clock node, wherein said connecting circuitry is operable alternatively to connect said second circuitry output to said circuit input and said third circuitry output to said clock node, or said second circuitry output to said clock node and said third circuitry output node to said circuit input.

2. The device of claim 1, wherein the first circuitry comprises flip-flop circuitry.

3. The device of claim 1, wherein said delay between said second and third circuitry input signals corresponds to a delay which causes said output condition to be a desired output condition.

4. The device of claim 3, wherein said desired output condition is a just valid condition, such that a decreased delay results in an invalid condition.

5. A device for measuring a response time of a circuit between an input node and a circuit output thereof, wherein said circuit output is connected via first connecting circuitry to an output pad, said device comprising a first timing signal source for providing a first timing signal to said input node via a first path, clocked circuitry having a clock node and being connected at said circuit output, said clocked circuitry having an output to said first connecting circuitry, said clocked circuitry being responsive to a clock signal at said clock node to provide to said first connecting circuitry a signal existing at said circuit output immediately prior to the occurrence of said clock signal, the device further comprising a second timing signal source for providing a second timing signal as said clock signal to said clock node via a second path, and means for determining a delay between said first and second timing signals, and further comprising controllable connecting circuitry disposed at inputs to said first and second paths and connected to said first and second timing signal sources, said controllable connecting circuitry having a control input for selectively connecting said first timing signal source to said first path and said second timing signal source to said second path, or said first timing signal source to said second path and said second timing signal source to said first path.

6. The device of claim 5, wherein said delay between said first and second timing signals corresponds to a delay which causes a desired condition at said output pad.

7. The device of claim 6, wherein said desired condition is a just valid condition such that a decreased delay results in an invalid condition.

8. The device of claim 5, wherein said controllable connecting circuitry comprises a multiplexer.

9. The device of any claim 5, wherein said clock circuitry comprises a flip-flop.

10. The device of claim 5, and further comprising a sensing device connected to said output pad for sensing a desired output thereat.

11. The device of claim 5 wherein said circuit comprises a static RAM.

12. The device of claim 11, wherein said static RAM comprises address latch circuitry having a latch clock node as said input node, an array of memory cells coupled to said address latch circuitry, and sense amplifier circuitry having a sense amplifier output node as said output node.

13. A method of measuring the response time of a circuit having a circuit output for providing an output in response to a stimulus applied to a circuit input, the method comprising:

providing second circuitry having a clock node, said second circuitry having an output for storing an output condition, said output condition corresponding to the state of said circuit output at the time of occurrence of a clock pulse at said clock node;

providing switching circuitry having inputs coupled to first and second input pads via a first and third circuitry, output coupled to said circuit input and said clock node;

controlling said switching circuitry to connect said first input pad to said circuit input, and said second input pad to said clock node;

successively applying a first timing signal to said first input pad whereby a said stimulus is applied to said circuit input, and at a variable first delay after each application, providing a second timing signal to said second input pad; whereby a clock pulse is applied to said clock node;

determining, a value of said variable first delay corresponding to a desired output condition of said second circuitry;

controlling said switching circuitry to connect said first input pad to said clock node and said second input pad to said circuit input;

successively applying a third timing signal to said second input pad whereby a said stimulus is applied to said circuit input, and at a variable second delay after each application providing a fourth timing signal to said first input pad, whereby a clock pulse is applied to said clock node;

determining a value of said variable second delay corresponding to said desired output condition of said second circuitry; and averaging said value of said variable first delay and said value of said variable second delay to provide said response time.

14. The method of claim 13, wherein said second circuitry comprises flip-flop circuitry.

* * * * *